(12) United States Patent
Uchiyama et al.

(10) Patent No.: US 7,795,165 B2
(45) Date of Patent: Sep. 14, 2010

(54) LEAD-FREE BISMUTH GLASS

(75) Inventors: Ichiro Uchiyama, Hyogo (JP); Tomoyuki Taguchi, Hyogo (JP); Ikuo Kuriyama, Hyogo (JP); Hisashi Matsuno, Tokyo (JP); Keiichiro Hayakawa, Tokyo (JP)

(73) Assignees: E.I. du Pont de Nemours and Company, Wilmington, DE (US); Nihon Yamamura Glass Co Ltd

( * ) Notice: Subject to any disclaimer, the term of this patent is extended or adjusted under 35 U.S.C. 154(b) by 205 days.

(21) Appl. No.: 12/084,509

(22) PCT Filed: May 26, 2006

(86) PCT No.: PCT/US2006/020867

§ 371 (c)(1),
(2), (4) Date: May 1, 2008

(87) PCT Pub. No.: WO2007/075190

PCT Pub. Date: Jul. 5, 2007

(65) Prior Publication Data

US 2009/0042715 A1    Feb. 12, 2009

(30) Foreign Application Priority Data

Dec. 27, 2005   (JP)   ............... 2005-375534

(51) Int. Cl.
*C03C 3/066* (2006.01)
*C03C 3/064* (2006.01)
*C08K 3/34* (2006.01)
*C08K 3/40* (2006.01)
*G03C 1/00* (2006.01)
*G03F 1/00* (2006.01)

(52) U.S. Cl. .................... 501/79; 501/77; 524/492; 524/494; 430/270.1; 430/271.1; 430/325; 430/905

(58) Field of Classification Search ............. 501/73, 501/77, 78, 79; 524/492, 494; 430/270.1, 430/271.1, 325, 905
See application file for complete search history.

(56) References Cited

U.S. PATENT DOCUMENTS

| 5,629,247 | A | | 5/1997 | Prunchak |
| 5,753,571 | A | * | 5/1998 | Donohue ............. 501/77 |
| 6,255,239 | B1 | * | 7/2001 | Sakoske ............ 501/77 |
| 6,403,694 | B1 | * | 6/2002 | Tose et al. ........... 524/493 |
| 6,507,148 | B1 | * | 1/2003 | Iguchi et al. ........ 313/582 |
| 6,797,452 | B2 | * | 9/2004 | Takano et al. ...... 430/270.1 |
| 2003/0228471 | A1 | * | 12/2003 | Hayakawa et al. ... 428/426 |

FOREIGN PATENT DOCUMENTS

| EP | 1 361 199 A1 | 11/2003 |
| JP | 11-139846 | 5/1999 |
| JP | 2003-034550 | 2/2003 |
| JP | 2003-128430 | 5/2003 |
| SU | 775061 | 10/1980 |
| SU | 1477706 | 5/1989 |

OTHER PUBLICATIONS

PCT International Search Report and Written Opinion for International Application No. PCT/US2006/020867 dated Oct. 18, 2006.

* cited by examiner

*Primary Examiner*—Karl E Group
*Assistant Examiner*—Noah S Wiese

(57) ABSTRACT

An object of the present invention is to provide a lead-free bismuth glass wherein decrease of the degree of accuracy of the patterning is prevented. Specifically, the present invention provides a lead-free bismuth glass characterized in that said lead-free bismuth glass is used for an optical patterning glass material which is patterned by light irradiation and the optical-absorption coefficient to light with a wavelength of 365 nm is 300 to 3000 $cm^{-1}$.

6 Claims, No Drawings

LEAD-FREE BISMUTH GLASS

TECHNICAL FIELD

The present invention relates to a lead-free bismuth glass used for an optical patterning glass material which is patterned by light irradiation.

BACKGROUND OF THE INVENTION

Due to the recent growing demand for space saving and energy saving a display panel has been used instead of the cathode-ray-tube image display device (hereinafter called "CRT"). For example, a plasma display panel (hereinafter called "PDP") and a field emission display (hereinafter called "FED") are widely used.

In the above described PDP and FED, two pieces of glass plates having electrodes in their surfaces are used for the front surface and the rear surface with said surfaces with the electrodes facing diagonally to each other. In the PDP, normally, electrodes are created in a strip shape on the rear surface of the glass plate and barriers made of glass are placed among said electrodes. Also, electrodes on the front surface of the glass plate are created in a stripe shape in a direction perpendicular to the electrodes on the rear surface. These electrodes on the front and rear surfaces are usually coated with a glass layer called dielectric layer. A display cell is determined by said front surface glass, rear surface glass and the barriers and a fluorescence material placed on said display cell is displayed by emitting light by the plasma discharge among the electrodes.

Also, in the FED, electrons are discharged by pixel from the electrode (cathode) on the rear surface to the electrode (anode) on the front surface and crashed against the fluorescence material which is coated on the anode thereby displaying the image. Normally, the cathode is created on the dielectric layer which is made on the glass plate and the electrodes other than the cathode are coated with the dielectric layer. This dielectric layer becomes an insulating film which prevents the electric discharge by coating the electrodes and their lines. The dielectric layer is made by a thick film technique which generally uses glass paste and the like.

Therefore, it is sought that the glass used for the barrier and the dielectric layer of the PDP and the dielectric layer of the FED is manufactured at a high degree of accuracy. For example, a patterning of the glass by photo lithography is applied. Normally, this patterning by photo lithography uses an optical patterning glass material such as photosensitive glass paste or photosensitive green sheet wherein an optical-insoluble type photosensitive resin or optical-soluble type photosensitive resin is mixed with a glass in a powder form (powdered glass). For example, when the dielectric layer of the FED is created by using a photosensitive green sheet which uses an optical-insoluble type photosensitive resin, said photosensitive green sheet is laminated on a glass substrate and a photo mask which is made so that light is transmitted only to the dielectric layer creating part, is further laminated. Then, by irradiating light with a wavelength of 365 nm which is called i line by using a mercury lamp, the photosensitive resin on the dielectric layer creating part is exposed to the light making said resin insoluble, removing the soluble part by using a solvent and sintering the sintering part.

Conventionally, the glass substrate on the front and rear surfaces of the PDP and the FED uses a soda lime glass and glass with a high distortion point wherein the content of alkali is decreased. Therefore, it is sought that the optical patterning glass material can be sintered at lower temperature and that the glass used for said optical patterning glass material has low softening temperature (softening point). As for the glass with a low softening point, for example, Japanese laid-open No. H08-119725 discloses that a glass with a low melting point which has PbO as the main element is used for the barriers of the PDP.

Recently, stemming from an increasing awareness of environmental protection, lead-free products are desired in electric equipment and electronic devices. Japanese laid-open No. H11-92168 discloses that lead-free alumino-borosilicate glass is used instead of a glass having PbO as the main element.

However, it is difficult to sufficiently reduce the softening point of the lead-free alumino-borosilicate glass. With the glass disclosed in Japanese laid-open No. H11-92168, it is difficult to obtain a glass with a low softening point which is suitable for being sintered on a soda lime glass or glass with a high distortion point wherein the content of alkali is decreased.

Japanese laid-open No. 2003-128430 discloses that, by using a lead-free bismuth glass which can easily obtain a glass with a lower softening point than that of lead-free alumino-borosilicate glass, the barriers and dielectric layer of the PDP are created. However, when a powdered glass is created by using the lead-free bismuth glass and said powdered glass is mixed with a photosensitive resin to create a optical patterning glass material such as a photosensitive glass paste and photosensitive green sheet, the degree of accuracy of the patterning is decreased. For example, when an optical-insoluble type photosensitive resin is used as the photosensitive resin, the patterns tend to be thicker than those of a photo mask. On the other hand, when an optical-soluble type photosensitive resin is used, the patterns tend to be thinner than those of the photo mask.

In other words, in the optical patterning glass material used for creating barriers and dielectric layer of the PDP and the dielectric layer of the FED, the conventional lead-free bismuth glass has a disadvantage of decreasing the degree of accuracy of the patterning of the optical patterning glass material.

SUMMARY OF THE INVENTION

An object of the present invention is to provide a lead-free bismuth glass which prevents the decrease of the degree of accuracy of the patterning.

The inventors of the present invention studied the lead-free bismuth glass used for the optical patterning glass material, and determined that said lead-free bismuth glass has a higher refractive index than those of the alumino-borosilicate glass and a glass having PbO as the main element. They also determined that, due to the above described fact, the light transmitted through the light transmitting part of the photo mask is dispersed and as a result, the part which must be shielded from the light by the photo mask is exposed to the light. Furthermore, when said lead-free bismuth glass has a predetermined optical-absorption coefficient, it is possible to prevent said light dispersion and prevent the decrease of the degree of accuracy of the patterning. As a result, the present invention was completed.

An aspect of the present invention solves the above described problem and characterized in that the invention regarding the lead-free bismuth glass is used for an optical patterning glass material which is patterned by light irradiation and the optical-absorption coefficient to light to a wavelength of 365 nm is 300 to 3000 $cm^{-1}$.

As described herein, the optical-absorption coefficient ($\alpha$:cm$^{-1}$) is the value obtained from the natural logarithm of the proportion of the transmitting light strength (I) after light is transmitted through the glass and the incident radiation strength (I0) before the light is transmitted through the glass and the thickness of the glass (d:cm) by using Lambert-Beer's law (below described formula 1). For example, this value can be obtained by making a glass thin leaf by sintering a powdered glass with a thickness of several tens of μm, measuring the thickness (d) of this glass thin leaf by a micrometer and at the same time measuring the light transmitting ratio (I0/I) of the glass thin leaf by a spectrophotometer.

$$\alpha = (1/d) \cdot \log(I0/I) \quad \text{Formula (1)}$$

In a further aspect of the invention, the lead-free bismuth glass is characterized in that the lead-free bismuth glass of the invention contains 40 to 80 wt % (wt % in equivalent of oxide; hereinafter the same as above) of $Bi_2O_3$, 1 to 20 wt % of $SiO_2$, 0.5 to 10 wt % of $Al_2O_3$, 5 to 20 wt % of $B_2O_3$, 1 to 20 wt % of ZnO, 0 to 5 wt % of $ZrO_2$ and 0 to 15 wt % of alkali earth metal oxides and further contains 0.1 to 2 wt % of one of oxides of Ti, V, Cr, Co, Fe, Ni, Mo, Ce, Sm and Eu which are the optical-absorption elements.

In a further aspect, the optical-absorption elements, of the lead-free bismuth glass, contain 0.1 to 1 wt % of Fe oxide in equivalent of oxide. In an additional aspect of the invention, the optical-absorption elements, of the lead-free bismuth glass, contain 0.5 to 2 wt % of at least one of Ti oxide and Co oxide in equivalent of oxide.

In an aspect of the invention, the lead-free bismuth glass is created in a powder form and used for said optical patterning glass material by mixing said lead-free bismuth glass with a photosensitive resin.

In a further aspect of the invention, the optical patterning glass material, in the lead-free bismuth glass, is a photosensitive glass paste. In a further aspect of the invention, the optical patterning glass material, in the lead-free bismuth glass, is a photosensitive green sheet.

Furthermore, in an aspect of the invention, the optical patterning glass material contains a photosensitive resin which is mixed with a powder-form glass wherein the lead-free bismuth glass is in a form of powder. Moreover, in an aspect of the invention, the optical patterning glass material is used for creating a dielectric layer of a display panel.

According to the present invention, since, in a lead-free bismuth glass used for an optical patterning glass material which is patterned by light irradiation, the optical-absorption coefficient to light with a wavelength of 365 nm is 300 to 3000 cm$^{-1}$, it is possible to prevent dispersion of light such as i line and prevent decrease of the degree of accuracy of the patterning of the optical patterning glass material.

Furthermore, when said lead-free bismuth glass contains 40 to 80 wt % of $Bi_2O_3$, 1 to 20 wt % of $SiO_2$, 0.5 to 10 wt % of $Al_2O_3$, 5 to 20 wt % of $B_2O_3$, 1 to 20 wt % of ZnO, 0 to 5 wt % of $ZrO_2$ and 0 to 15 wt % of alkali earth metal oxides and further contains 0.1 to 2 wt % of one of oxides of Ti, V, Cr, Co, Fe, Ni, Mo, Ce, Sm and Eu which are the optical-absorption elements, it is possible to decrease the softening temperature of said lead-free bismuth glass to 580° C. or lower which is sufficiently lower than the practical heat treatment maximum temperature (normally, 600° C.) of a glass with a high distortion point. As a result, the optical patterning glass material can become suitable for creating the barriers and dielectric layer of the PDP and the dielectric layer of the FED.

Also, the optical patterning glass material where said lead-free bismuth glass is used can be sintered at lower temperature than the case where the alumino-borosilicate glass is used and elaborate patterns can be created with an excellent workability.

DETAILED DESCRIPTION OF THE INVENTION

The embodiments of the present invention will be described by using the optical pattering glass material as a non-limiting example.

The optical patterning glass material of the present invention contains a photosensitive resin and a lead-free powdered glass. This powdered glass is made by crushing the lead-free bismuth glass into fine powder and the lead-free bismuth glass used for said powdered glass has an optical-absorption coefficient of 300 to 3000 cm$^{-1}$ to light with a wavelength of 365 nm. The reason why the optical-absorption coefficient of the lead-free bismuth glass has the above described range is that, when the optical-absorption coefficient is less than 300 cm$^{-1}$, the light dispersion preventing effect is not sufficient and the degree of accuracy of the patterning of the optical patterning glass material is decreased. On the other hand, when the optical-absorption coefficient is more than 3000 cm$^{-1}$, since the light transmitting property in a direction of the thickness of the optical patterning glass material is significantly decreased, the lead-free bismuth glass cannot be used. In this case, for example, the photosensitivity (insolubilization or solubilization of the photosensitive resin) of the patterning glass material in the part where light is irradiated, is insufficient and the degree of accuracy of the patterning is decreased. Based on the above described points, it is preferable that said optical-absorption coefficient is 500 to 2500 cm$^{-1}$.

A commonly-used photosensitive resin which becomes insoluble or soluble by light irradiation can be used for the above described photosensitive resin. Examples of the optical-insoluble type photosensitive resin which becomes insoluble by light irradiation include a mixture of monomer or oligomer which has one or more of unsaturated groups in the molecule with polymer, mixture of a photosensitive material such as aromatic group diazo compound and organic halogen compound with polymer, graft polymer wherein a photoreactive (photosensitive) group is grafted with polymer and so called diazo resin.

Also, examples of the optical-soluble type photosensitive material include a complex of diazo compound with inorganic salt or organic acid, mixture of quinone diazo group with polymer and mixture of quinone diazo group such as naphthoquinone 1,2-diadide-sulfonate ester of phenol and novolac resin with polymer.

As the above described lead-free bismuth glass, it is preferable to use the one which contains 40 to 80 wt % (wt % in equivalent of oxide; hereinafter the same as above) of $Bi_2O_3$, 1 to 20 wt % of $SiO_2$, 0.5 to 10 wt % of $Al_2O_3$, 5 to 20 wt % of $B_2O_3$, 1 to 20 wt % of ZnO, 0 to 5 wt % of $ZrO_2$ and 0 to 15 wt % of alkali earth metal oxides and further contains 0.1 to 2 wt % of one of oxides of Ti, V, Cr, Co, Fe, Ni, Mo, Ce, Sm and Eu which are the optical-absorption elements. By using the lead-free bismuth glass with the above described composition, it is possible to decrease the softening temperature of the powdered glass to 580° C. or lower which is sufficiently lower than the practical heat treatment maximum temperature (normally, 600° C.) of a glass with a high distortion point. As a result, the optical patterning glass material can become suitable for creating the barriers and dielectric layer of the PDP and the dielectric layer of the FED.

The above described $Bi_2O_3$ is necessary for obtaining the lead-free bismuth glass which has a softening point of 580° C.

or lower. The reason why the content of $Bi_2O_3$ is 40 to 80 wt % is that, when the content is less than 40 wt %, the softening point of the obtained lead-free bismuth glass is increased exceeding 580° C. and that, when the content is more than 80 wt %, the lead-free bismuth glass is easily crystallized and it is difficult to sinter the glass.

$SiO_2$ and $Al_2O_3$ are the compounds necessary for widening the glass formation regions and stabilizing the glass. The reason why the content of $SiO_2$ is 1 to 20 wt % and the content of $Al_2O_3$ is 0.5 to 10 wt % is that, if the contents of these compounds are other than these ranges, the lead-free bismuth glass becomes unstable. Also, when the contents are more than the maximum limits, the softening point of the lead-free bismuth glass is increased exceeding 580° C.

The above described $B_2O_3$ is also the compound necessary for obtaining the lead-free bismuth glass with a softening point of 580° C. or lower. The reason why the content of $B_2O_3$ is 5 to 20 wt % is that $B_2O_3$ is also effective for stabilization of the glass and has an effect of decreasing the softening point of the lead-free bismuth glass. When the content is less than 5 wt %, the obtained lead-free bismuth glass may become unstable. Also, when the content exceeds 20 wt %, the softening point of the lead-free bismuth glass is increased exceeding 580° C.

The above described ZnO is also the compound necessary for stabilizing the glass. The reason why the content of ZnO is 1 to 20 wt % is that, when the content is less than 1 wt %, the obtained lead-free bismuth glass becomes unstable and when the content is more than 20 wt %, the obtained lead-free bismuth glass is likely to cause crystallization.

The above described $ZrO_2$ is the compound discretionally selected for the lead-free bismuth glass of the present embodiment and effective for adjusting the viscosity of the glass and the thermal expansion coefficient. However, when the content of $ZrO_2$ is more than 5 wt %, crystal may be deposited in the glass. Therefore, it is preferable that the content is 5 wt % or less.

The above described alkali earth metal oxides, that is, MgO, CaO, BaO and SrO are also the compounds discretionally selected for the lead-free bismuth glass of the present invention and effective for stabilizing the glass and decreasing the melting point. However, when the contents of these alkali earth metal oxides are increased, the softening point of the glass may be increased and the glass may be unstabilized. Therefore, the total content of said alkali earth metal oxides is preferably 15 wt % or less.

Oxides including oxide of Ti, V, Cr, Co, Fe, Ni, Mo, Ce, Sm and Eu are the optical-absorbing compounds. When the lead-free bismuth glass contains these oxides, the optical-absorption coefficient of the lead-free bismuth glass to a wavelength of 365 nm is increased. The total content of oxides of Ti, V, Cr, Co, Fe, Ni, Mo, Ce, Sm and Eu, is 0.1 to 2 wt % in equivalent of oxides so that the softening point of said lead-free bismuth glass is 580° C. or less and the optical-absorption coefficient is 300 to 3000 $cm^{-1}$. The reason why the total content of oxides of Ti, V, Cr, Co, Fe, Ni, Mo, Ce, Sm and Eu is the above described range is that, when the content is less than 0.1 wt % in equivalent of oxides, or when it is more than 2 wt %, the softening point of the lead-free bismuth glass cannot be 580° C. or less and also the optical-absorption coefficient cannot be 300 to 3000 $cm^{-1}$.

Here, when V, Fe, Ni and Mo are used as the above described oxides of Ti, V, Cr, Co, Fe, Ni, Mo, Ce, Sm and Eu, the content is preferably 0.1 to 1 wt % in equivalent of oxides, or more preferably, the content is 0.2 to 0.5 wt %. When Ti, Cr, Co, Ce, Sm and Eu are used, the content is preferably 0.5 to 2 wt % in equivalent of oxides, or more preferably, the content is 1 to 2 wt %. Among the above described oxides, it is preferable to use Ti, Co or Fe. Especially, in the case Fe is used, Fe is not only inexpensive but also has excellent effects of easily controlling the optical-absorption coefficient of the glass while limiting its influence on the properties of the glass. Furthermore, it is preferable that the above described Ti, V, Cr, Co, Fe, Ni, Mo, Ce, Sm and Eu respectively have valences of $Ti^{4+}$, $V^{3+}$, $Cr^{6+}$, $Co^{2+}$, $Fe^{3+}$, $Ni^{2+}$, $Mo^{3+}$, $Ce^{4+}$, $Sm^{3+}$ and $Eu^{2+}$.

When powdered glass is created from the lead-free bismuth glass with the above described composition, all the original materials are mixed and melted at, for example, 1000 to 1100° C. thereby obtaining a uniform glass. Then, the obtained glass is crushed by using a crushing means such as a mill thereby making lead-free powdered glass with a uniform property. Here, by melting the glass in an oxidized atmosphere, oxides of Ti, V, Cr, Co, Fe, Ni, Mo, Ce, Sm and Eu in the lead-free bismuth glass can be easily created as the oxides having valences of $Ti^{4+}$, $V^{3+}$, $Cr^{6+}$, $Co^{2+}$, $Fe^{3+}$, $Ni^{2+}$, $Mo^{3+}$, $Ce^{4+}$, $Sm^{3+}$ and $Eu^{2+}$. Furthermore, by using the powdered glass made with the above described composition, a photosensitive resin and a solvent, it is possible to make a photosensitive glass paste. Alternatively, it is possible to make a photosensitive green sheet by making a sheet from the above described photosensitive glass paste after said paste is changed to a slurry form.

EXAMPLE

Next, the present invention will be described in detail by referring to the examples. However, the present invention is not limited to these examples.

Examples 1 to 8

Comparative Examples 1 and 2

The original materials were formulated so that they had the composition shown in Table 1. After said original materials were mixed, they were melted at 1000 to 1100° C. for 1 to 2 hours. The melted glass was rapidly cooled in a cooling roller made of stainless steel thereby obtaining glass flakes. Next, after the glass flakes were crushed, they were classified so that the average particle diameter was 0.5 to 1.5 μm thereby making the lead-free bismuth glass of each example and comparative examples. Also, the above described powdered glass was mixed with optical-insoluble photosensitive resin made of a binder resin, a photopolymerization polyfunctional monomer, photopolymerization promoter and photopolymerization initiator thereby making a photosensitive glass paste. Then, the obtained photosensitive glass paste was screen printed and dried on a glass substrate (glass with a high distortion point, made by Asahi Glass Co., "PD-200") for two times respectively so that the glass substrate had a thickness of 20 μm after the sintering process. This drying process was conducted by using a hot-air furnace at 100° C. for 30 to 45 minutes. The dried glass paste film which was obtained in the above described manner was exposed to light with an exposure amount of 50 to 500 $mJ/cm^2$ by using exposure equipment which used a high-pressure mercury lamp as the light source. After that, the exposed glass paste was alkali-developed, washed with water and dried, which was then sintered. Here, the glass paste film was sintered for 30 minutes at 520 to 560° C. at which the glass substrate was not deformed by heat and as a result, a glass film with a thickness of 20 μm was created on the glass substrate.

TABLE 1

| Compounding agents (wt %) | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| $Bi_2O_3$ | 40 | 65 | 75 | 80 | 65 | 65 | 65 | 65 | 65 | 65 |
| $SiO_2$ | 1 | 8 | 8 | 10 | 8 | 8 | 8 | 8 | 8 | 8 |
| $Al_2O_3$ | 5 | 3 | 0.5 | 3 | 3 | 3 | 3 | 3 | 3 | 2 |
| $B_2O_3$ | 20 | 10 | 12 | 5 | 10 | 10 | 10 | 10 | 10.5 | 10 |
| ZnO | 18.5 | 11.5 | 1 | 1.4 | 11.8 | 11 | 10 | 10.4 | 11.5 | 10.5 |
| BaO | 15 | 2 | | | 2 | 2 | 2 | 2 | 2 | 2 |
| $ZrO_2$ | | | 3 | 0.5 | | | | | | |
| $Fe_2O_3$ | 0.5 | 0.5 | 0.5 | 0.1 | 0.2 | 1.0 | | | | 2.5 |
| $TiO_2$ | | | | | | | 2.0 | | | |
| CoO | | | | | | | | 1.6 | | |
| Total | 100 | 100 | 100 | 100 | 100 | 100 | 100 | 100 | 100 | 100 |
| Optical-absorption coefficient ($cm^{-1}$) | 1383 | 1088 | 1222 | 331 | 515 | 2831 | 1982 | 2100 | 289 | 3113 |

(Evaluation)

1) Optical-Absorption Coefficient

By using a spectrophotometer made by Hitachi High-technologies Co., Ltd. (Model Name "U-3010 (without an integrating sphere)"), the light transmitting ratio of light with a wavelength of 365 nm (I/I0: Here, "I0" represents the incident light strength and "I" represents the transmitting light strength) was measured on the glass film with a thickness of 20 μm which was created by using the powdered glass of each example and comparative example. Based on the light transmitting ratio (I/I0) and the thickness of the glass film (d: $2\times10^{-3}$ cm), the optical-absorption coefficient ($\alpha$:$cm^{-1}$) was obtained by using the below described formula (2). The result is shown in Table 1.

$$\alpha = (1/d) \cdot \log(I0/I) \quad \text{Formula (2)}$$

2) Softening Point

By using a DTA made by Rigaku Co., Ltd. (Model name: "TG-8120"), a differential thermal analysis was made on the powdered glass of each example and comparative example in air atmosphere at a rate of temperature rise of 20° C./minute and the point at which the endothermic peak was finished during the melting process was obtained by a tangent line method thereby determining the softening point.

3) Fineness

By using a screen printing method, the powdered glass of each example and comparative example were printed and dried on glass with a high distortion point (made by Asahi Glass, "PD-200"). After that, by using photo lithography, patterns with a line width of about 50 μm, height of about 20 μm, and pitch of about 220 μm were created in a striped shape on the dried powdered glass, which were then sintered in air at 520 to 560° C. for 30 minutes. The samples obtained in the above describe manner were evaluated. The fineness of the samples was evaluated by observing the line widths and heights or the patterns by using an optical microscope. The samples with the line widths of less than 45 μm were considered "X", the samples with the line widths of 45 μm or more to less than 50 μm were considered "O" and the samples with the line widths of 50 μm or more were considered as "OO".

TABLE 2

| | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| Softening point (° C.) | 548 | 505 | 507 | 489 | 503 | 508 | 513 | 504 | 503 | 534 |
| Fineness | OO | OO | OO | O | OO | O | OO | OO | X | X |

As described above, it is found that, by using the lead-free bismuth glass characterized in that said lead-free bismuth glass is used for an optical patterning glass material which is patterned by light irradiation and the optical-absorption coefficient to light with a wavelength of 365 nm is 300 to 3000 $cm^{-1}$, it is possible to apply patterning with an excellent fineness. That is, it is found that, while the lead-free bismuth glass is used, dispersion of light such as i line is prevented. Furthermore, it is found that, when the above described lead-free bismuth glass contains 40 to 80 wt % of $Bi_2O_3$, 1 to 20 wt % of $SiO_2$, 0.5 to 10 wt % of $Al_2O_3$, 5 to 20 wt % of $B_2O_3$, 1 to 20 wt % of ZnO, 0 to 5 wt % of $ZrO_2$ and 0 to 15 wt % of alkali earth metal oxides and further contains 0.1 to 2 wt % of one of oxides of Ti, V, Cr, Co, Fe, Ni, Mo, Ce, Sm and Eu which are the optical-absorption elements, the softening temperature of said lead-free bismuth glass can be 580° C. or lower which is the temperature sufficiently lower than the maximum temperature (normally 600° C.) for heat-treating glass with a high distortion point and the optical patterning glass material can be made suitable for creating the barriers and dielectric layer of the PDP and the dielectric layer for the FED.

What is claimed is:

1. An optical patterning glass material characterized in that said optical patterning glass material contains a photosensitive resin which is mixed with a powder-form lead-free bismuth glass wherein the optical-absorption coefficient of the material at a wavelength of 365 nm is 300 to 3000 $cm^{-1}$, and wherein the lead-free bismuth glass comprises 40 to 80 wt % of $Bi_2O_3$, 1 to 20 wt % of $SiO_2$, 0.5 to 10 wt % of $Al_2O_3$, 5 to 20 wt % of $B_2O_3$, 1 to 20 wt % of ZnO, 0 to 5 wt % of $ZrO_2$, 0 to 15 wt % of alkaline earth metal oxides and 0.1 to 2 wt % of oxides of one or more optical absorption elements selected from the group consisting of: Ti, V, Cr, Co, Fe, Ni, Mo, Ce, Sm and Eu.

2. The optical patterning glass material as set forth in claim 1 which is used for creating a dielectric layer of a display panel.

3. The optical patterning glass material of claim 1, wherein the oxides of one or more optical absorption elements comprises 0.1 to 1 wt % of Fe oxide.

4. The optical patterning glass material of claim 1, wherein the oxides of one or more optical absorption elements comprises 0.5 to 2 wt % of Ti oxide or Co oxide.

5. The optical patterning glass material of claim 1, wherein said optical patterning glass material is a photosensitive glass paste.

6. The optical patterning glass material of claim 1, wherein said optical patterning glass material is a photosensitive green sheet.

* * * * *